United States Patent
Hasegawa (10) Patent No.: US 8,754,519 B2
(45) Date of Patent: Jun. 17, 2014

(54) PACKAGE FOR HOUSING SEMICONDUCTOR ELEMENT AND SEMICONDUCTOR DEVICE USING THE SAME

(75) Inventor: Tsuyoshi Hasegawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 479 days.

(21) Appl. No.: 12/978,813

(22) Filed: Dec. 27, 2010

(65) Prior Publication Data
US 2011/0186983 A1    Aug. 4, 2011

(30) Foreign Application Priority Data
Feb. 3, 2010   (JP) ................................. 2010-022518

(51) Int. Cl.
*H01L 23/02*     (2006.01)
*H01L 23/12*     (2006.01)
*H01L 23/053*    (2006.01)
*H01L 23/10*     (2006.01)
*H01L 23/04*     (2006.01)

(52) U.S. Cl.
USPC ........... 257/698; 257/678; 257/701; 257/704; 257/710; 257/730; 257/E23.181; 257/E23.011; 361/752

(58) Field of Classification Search
USPC ......... 257/678, 698, 701, 704, 710, 730, 727, 257/E23.084; 361/724, 728, 736, 748, 752
See application file for complete search history.

(56) References Cited

U.S. PATENT DOCUMENTS

| | | | | |
|---|---|---|---|---|
| 3,489,956 A | * | 1/1970 | Takayuki et al. | 257/664 |
| 5,572,065 A | * | 11/1996 | Burns | 257/666 |
| 6,172,415 B1 | | 1/2001 | Ishijima et al. | |
| 6,183,874 B1 | * | 2/2001 | Yamagata et al. | 428/472 |
| 6,365,961 B1 | | 4/2002 | Tomie | |
| 6,455,932 B1 | * | 9/2002 | Katahira | 257/728 |
| 7,745,928 B2 | | 6/2010 | Hasegawa | |
| 2006/0012016 A1 | * | 1/2006 | Betz et al. | 257/678 |

(Continued)

FOREIGN PATENT DOCUMENTS

| | | |
|---|---|---|
| EP | 0 110 997 A1 | 6/1984 |
| JP | 7-78901 | 3/1995 |
| JP | 2004-288949 | 10/2004 |
| JP | 2006-190712 | 7/2006 |

OTHER PUBLICATIONS

Korean Office Action issued Nov. 30, 2012, in Korea Patent application No. 10-2010-138678 (with English translation).

(Continued)

*Primary Examiner* — Teresa M Arroyo
(74) *Attorney, Agent, or Firm* — Oblon, Spivak, McClelland, Maier & Neustadt, L.L.P.

(57) ABSTRACT

According to one embodiment, a package for housing semiconductor element includes: a base plate including a top surface and a recessed portion formed as a downwardly-recessed portion of the top surface; a peripheral wall provided on the top surface of the base plate; a lid provided on an upper side of the peripheral wall and forming a semiconductor element housing space in cooperation with the base plate and the peripheral wall; and a feed-through terminal including a bottom end and fixed to the recessed portion so that the bottom end is located at a lower position than the top surface of the base plate except the recessed portion.

8 Claims, 8 Drawing Sheets

(56) References Cited

U.S. PATENT DOCUMENTS

2006/0151796 A1* 7/2006 Kobayashi et al. ............ 257/85
2008/0267582 A1 10/2008 Yamauchi
2008/0286602 A1 11/2008 Hasegawa
2009/0039500 A1 2/2009 Ito et al.
2009/0091891 A1 4/2009 Hasegawa
2009/0205806 A1 8/2009 Hasegawa
2010/0127391 A1 5/2010 Hasegawa
2010/0186939 A1 7/2010 Hasegawa

OTHER PUBLICATIONS

Extended European Search Report issued Jul. 20, 2011, in Patent Application No. 10252254.7.
Combined Taiwanese Office Action and Search Report issued May 22, 2013, in Taiwanese Patent Application No. 099146864 with English translation.

* cited by examiner

PRIOR ART

FIG. 13

PACKAGE FOR HOUSING SEMICONDUCTOR ELEMENT AND SEMICONDUCTOR DEVICE USING THE SAME

CROSS-REFERENCE TO RELATED APPLICATION

This application is based upon and claims the benefit of priority from the prior Japanese Patent Application No. 2010-22518, filed on Feb. 3, 2010, the entire contents of which are incorporated herein by reference.

FIELD

The embodiments described herein relate to a package for housing a semiconductor element (hereinafter, also referred to as "semiconductor element housing package") and to a semiconductor device using the package.

BACKGROUND

JP, P2004-288949A discloses a semiconductor device including a semiconductor element and a package housing this semiconductor element. The package includes a base board, a peripheral wall provided on the top surface of the base board so as to surround a semiconductor element, and a lid provided on the upper side of the peripheral wall. The base board, the peripheral wall and the lid together form a space where a semiconductor element is housed (hereinafter, also referred to as "semiconductor element housing space"). In this semiconductor element housing space, the semiconductor element and an internal substrate with a matching circuit mounted thereon are fixed on the top surface of the base board. Two cut-away portions are provided in the peripheral wall of the package. Feed-through terminals to connect the internal substrate to peripheral electronic parts provided outside the package are fixed to the cut-away portions of the peripheral wall. The feed-through terminals and the internal substrate are connected to each other by wires formed by wire bonding or other methods. The internal substrate and the semiconductor element are also connected to each other by a wire formed by wiring bonding or other methods.

In recent years, to meet the demand for smaller and lighter-weight semiconductor devices, semiconductor element housing packages have been desired to have a smaller dimension in the thickness direction thereof. On the other hand, the dimension of each feed-through terminal in the thickness direction sometimes increases because the voltage and the frequency used by the semiconductor device serve as constraints on the size and the insulation resistance of the feed-through terminal. In these circumstances, thinning of the semiconductor element housing package described in JP, P2004-288949A is difficult due to the large dimension of the feed-through terminal in the thickness direction.

In addition, semiconductor devices tend to contain thinner semiconductor elements and thinner internal substrates. Accordingly, if feed-through terminals of the semiconductor element housing package described in JP, P2004-288949A have a large dimension in the thickness direction thereof, there is a level difference between the position where the wire connecting the corresponding feed-through terminal to the internal substrate is connected to the feed-through terminal and the position where the wire is connected to the internal substrate. The level difference elongates the wire connecting the internal substrate to the feed-through terminal and thus generates undesirable inductance (L). The inductance (L) causes mismatching of impedances between the internal substrate and the feed-through terminal, and thus impairs electrical characteristics, such as the output and the efficiency, of the semiconductor device.

DETAILED DESCRIPTION

According to one embodiment, a package for housing semiconductor element includes: a base plate including a top surface and a recessed portion formed as a downwardly-recessed portion of the top surface; a peripheral wall provided on the top surface of the base plate; a lid provided on an upper side of the peripheral wall and forming a semiconductor element housing space in cooperation with the base plate and the peripheral wall; and a feed-through terminal including a bottom end and fixed to the recessed portion so that the bottom end is located at a lower position than the top surface of the base plate except the recessed portion.

According to one embodiment, a semiconductor device includes: the package for housing semiconductor element according above-mentioned; an internal substrate placed on the top surface of the base plate in the semiconductor element housing space; an semiconductor element placed on the top surface of the base plate in the semiconductor element housing space; a first wire connecting the feed-through terminal and the internal substrate; and a second wire connecting the internal substrate and the semiconductor element.

Embodiment 1

Embodiment 1 is described by referring to FIGS. 1 to 5.

Figure 1:
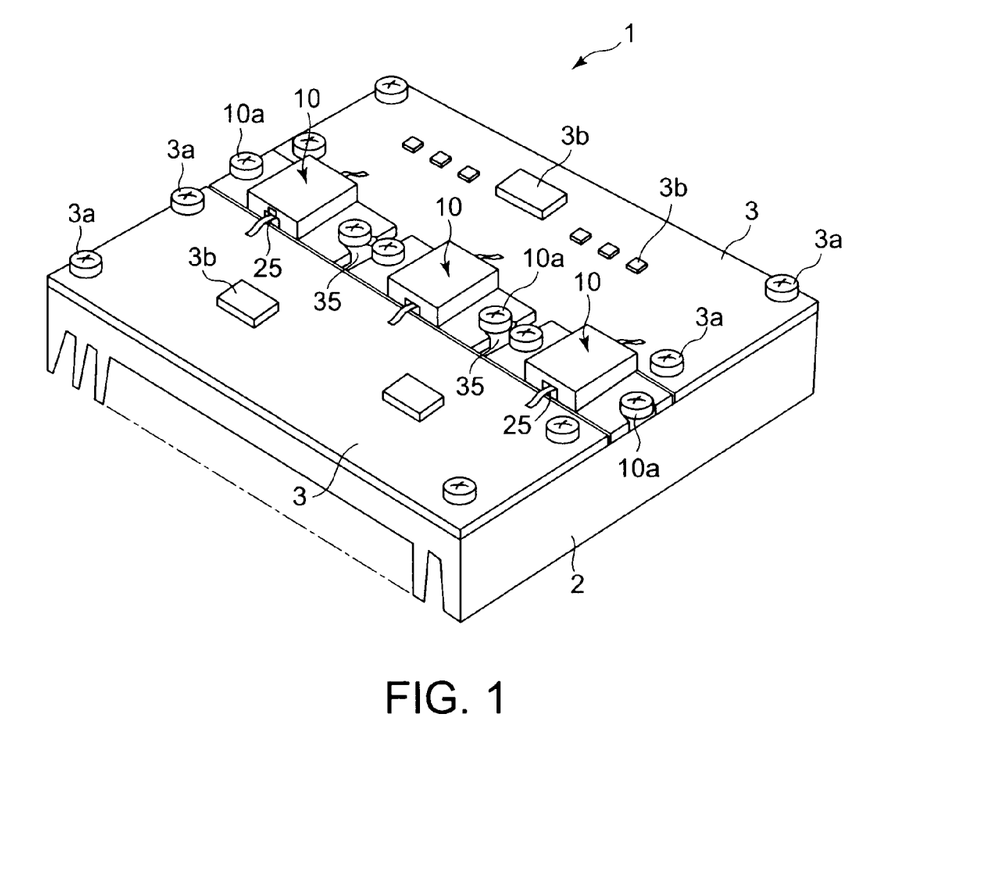
FIG. 1 is a perspective view showing the configuration of an electric circuit apparatus using a semiconductor device of Embodiment 1.

FIG. 1 shows the configuration of an electric circuit apparatus 1 using a semiconductor device 10. The electric circuit apparatus 1 includes: a heat sink 2, which is a radiator plate;

and plural peripheral-circuit boards 3, which are attached to the heat sink 2. The peripheral-circuit boards 3 are screwed to the heat sink 2 with fastening screws 3a. Thin surface-mounted peripheral electronic parts 3b are fixed to the top surfaces of the peripheral-circuit boards 3 by brazing or by other methods. Plural semiconductor devices 10 are screwed to the heat sink 2 with fastening screws 10a.

Figure 2:
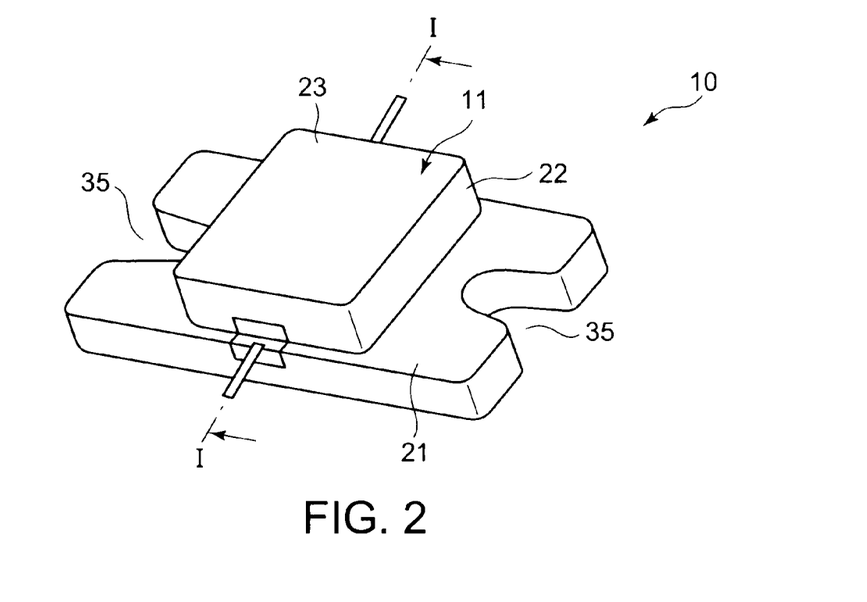
FIG. 2 is a perspective view showing the semiconductor device of Embodiment 1.
Figure 3:
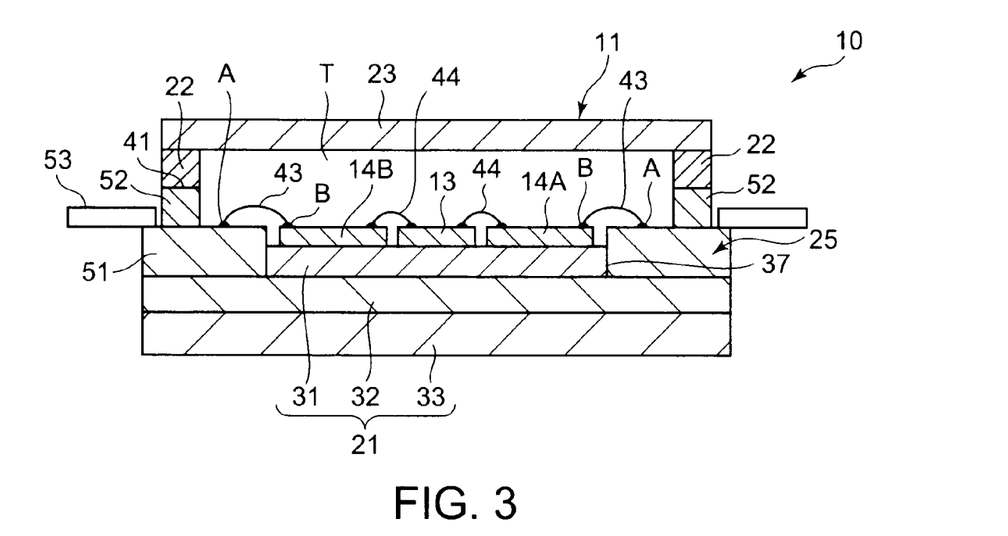
FIG. 3 is a sectional view taken along a line I-I of FIG. 2.

FIGS. 2 and 3 show the configuration of each semiconductor device 10. The semiconductor device 10 includes a semiconductor element housing package 11 that forms a semiconductor element housing space T designed to house a semiconductor element 13 and internal substrates 14A and 14B with matching circuits formed thereon. The semiconductor element housing package 11 is made mainly of a metal to dissipate heat generated by the semiconductor element 13 and for other reasons. The semiconductor element housing package 11 includes: a base plate 21, which is a base board; a peripheral wall 22 provided on the top surface of the base plate 21 so as to surround the semiconductor element 13 and the internal substrates 14A and 14B; and a lid 23 provided on the upper side of the peripheral wall 22.

Figure 4:
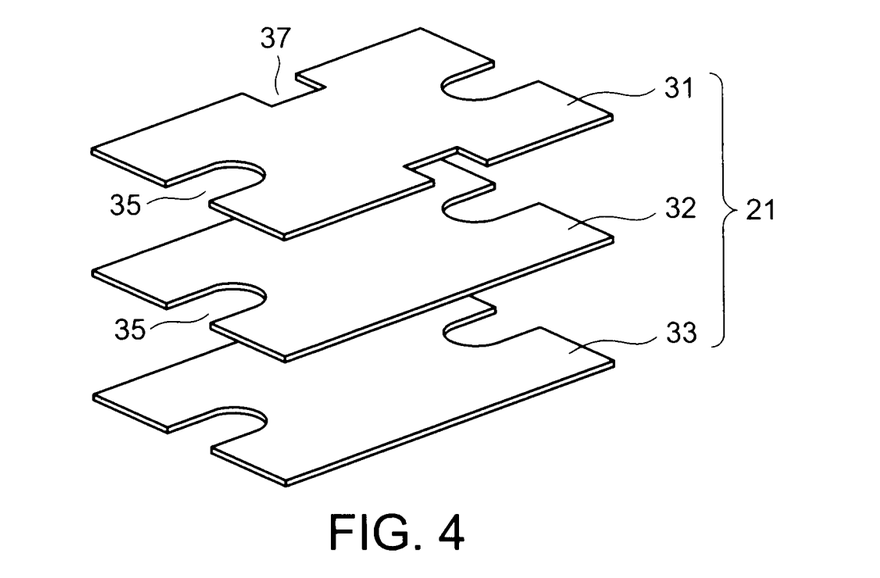
FIG. 4 is a perspective view showing a state where a base plate of a semiconductor element housing package of the semiconductor device of Embodiment 1 is separated into layers.

FIG. 4 shows the configuration of the base plate 21. As FIGS. 3 and 4 show, the base plate 21 has a laminate structure including a first layer 31, a second layer 32, and a third layer 33, which are depicted in this order from the top. These three layers 31 to 33 are integrated together by brazing or by other methods. The semiconductor element 13 and the plural thin internal substrates 14A and 14B are fixed to the top surface of the first layer 31 by brazing or by other methods. Each of the internal substrates 14A and 14B includes an insulation member made of ceramics or the like material and a matching circuit provided thereon. The matching circuit is thus isolated from the base plate 21.

The first and the third layers 31 and 33 are made of materials with high thermal conductivities such as copper (Cu), and transfer easily the heat from the semiconductor element 13 to the heat sink 2 (see FIG. 1). The second layer 32 is made of a material with a low thermal conductivity such as molybdenum (Mo), and adjusts the coefficient of thermal expansion (CTE) of the base plate 21 to a level that is substantially equal to the CTE of the semiconductor element 13 and to the CTEs of the internal substrates 14A and 14B. A big difference between the CTE of the base plate 21 and the CTEs of the semiconductor element 13 and the internal substrates 14A and 14B causes such inconveniences as breakages of the semiconductor element 13 and the internal substrates 14A and 14B. The second layer 32 decreases the difference between the CTE of the base plate 21 and the CTEs of the semiconductor element 13 and the internal substrates 14A and 14B, and thereby prevents the breakages of the semiconductor element 13 and the internal substrates 14A and 14B.

As FIGS. 2 and 4 show, the base plate 21 has two hole portions 35 bored through the base plate 21 in the thickness direction thereof. The fastening screws 10a (see FIG. 1) are inserted respectively into the hole portions 35 to fix the semiconductor device 10 to the heat sink 2.

As FIGS. 3 and 4 show, the base plate 21 has two recessed portions 37. Each recessed portion 37 is recessed from the top surface of the base plate 21 by an amount equivalent to the thickness of the first layer 31. To form the recessed portions 37, hole portions are bored through the first layer 31 in the thickness direction thereof before the first layer 31 is brazed to the second layer 32.

Figure 5:
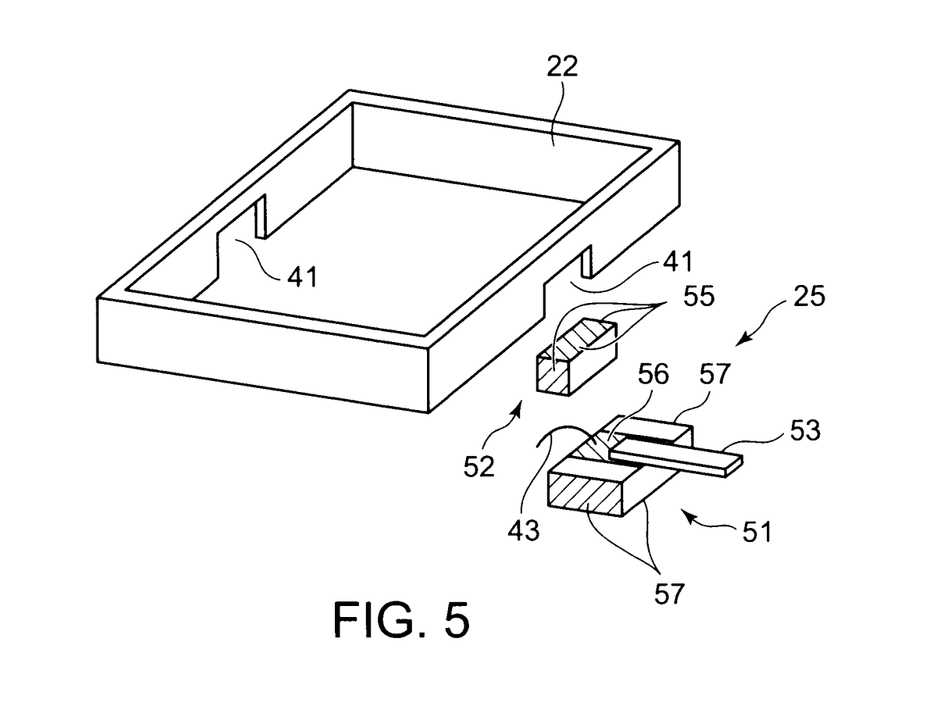
FIG. 5 is a perspective view showing a peripheral wall of the semiconductor element housing package of Embodiment 1.

FIG. 5 shows the configuration of the peripheral wall 22 of the semiconductor element housing package 11. As FIGS. 2 and 5 show, the peripheral wall 22 has two cut-away portions 41, which are provided at positions corresponding respectively to the recessed portions 37 of the base plate 21. In this embodiment, the cut-away portions 41 are provided respectively in a pair of opposed walls.

As FIGS. 2 and 3 show, the semiconductor element housing package 11 includes feed-through terminals 25 to connect the internal substrates 14A and 14B to the peripheral electronic parts 3b (see FIG. 1) provided outside the semiconductor element housing package 11. Each feed-through terminal 25 is placed in a portion where one of the recessed portions 37 and the corresponding cut-away portion 41 are located.

As FIGS. 3 and 5 show, each feed-through terminal 25 includes a lower component 51 placed in the corresponding recessed portion 37 of the base plate 21 and an upper component 52 placed in the corresponding cut-away portion 41 of the peripheral wall 22. Metalized joint portions 55 are formed on the top surface and on two side surfaces of the upper component 52 by metal coating.

A metalized wiring layer 56 is provided on the top surface of the lower component 51 by metal coating. The lower component 51 and the upper component 52 are joined together at the metalized wiring layer 56. A lead terminal 53 to connect the metalized wiring layer 56 to the corresponding peripheral electronic parts 3b (see FIG. 1) is connected to the metalized wiring layer 56. The metalized wiring layer 56 penetrates the peripheral wall 22 from inside to outside. To put it differently, the metalized wiring layer 56 extends from the inside to the outside of the semiconductor element housing space T. In addition, metalized joint portions 57 are formed on the bottom surface and on the two side surfaces of the lower component 51 by metal coating.

When the peripheral wall 22 is fixed to the base plate 21 by brazing or by other methods, each feed-through terminal 25 is placed in a portion where the corresponding recessed portion 37 of the base plate 21 and the corresponding cut-away portion 41 of the peripheral wall 22 are located. The upper component 52 is fixed to the peripheral wall 22 by inserting the upper component 52 into the cut-away portion 41 of the peripheral wall 22 and then brazing the metalized joint portion 55 to the peripheral wall 22. The lower component 51 is fixed to the base plate 21 by inserting the lower component 51 into the recessed portion 37 of the base plate 21 and then brazing the metalized joint portion 57 to the base plate 21. Note that each of the lower component 51 and the upper component 52 is made of an insulating material, such as ceramics, except the metalized joint portions 55 and 57 and the metalized wiring layer 56. Accordingly, the metalized wiring layer 56 is isolated from the base plate 21 by the lower component 51 and from the peripheral wall 22 by the upper component 52.

As FIG. 3 shows, the lower component 51 of each feed-through terminal 25 has a larger thickness than that of each of the internal substrates 14A and 14B. The bottom surface of the lower component 51 is fixed to the top surface of the second layer 32 of the base plate 21. Accordingly, the lower component 51 of the feed-through terminal 25 is fixed to the floor of the recessed portion 37, and the bottom end of the feed-through terminal 25 is located at a lower position than the top surface of the base plate 21. The top surface of the lower component 51 and the top surfaces of the internal substrates 14A and 14B are positioned at substantially the same height.

As FIG. 3 shows, in the semiconductor device 10, each feed-through terminal 25 is connected to the corresponding one of the internal substrates 14A and 14B with a wire 43 of wire bonding or with other means, and the semiconductor element 13 is connected to the internal substrates 14A and 14B with wires 44 of wire bonding or with other means.

Specifically, an end of each wire 43 is connected to the corresponding feed-through terminal 25 at a connection position A, whereas the other end of the wire 43 is connected to the corresponding one of the internal substrates 14A and 14B at a connection position B. The connection position A of each wiring 43 to the corresponding feed-through terminal 25 is provided on the metalized wiring layer 56 provided on the top surface of the corresponding lower component 51. The current coming from the peripheral electronic parts 3b flows through one of the lead terminals 53, the corresponding metalized wiring layer 56, and the corresponding wire 43 to reach the internal substrate 14A, and then flows through the corresponding wire 44 to reach the semiconductor element 13. The current amplified by the semiconductor element 13 flows through the other wire 44, the internal substrate 14B, the other wire 43, the other metalized wiring layer 56, and the other lead terminal 53, and is outputted to the peripheral circuit parts 3b. Since the top surfaces of the lower components 51 and the top surfaces of the internal substrates 14A and 14B are positioned at substantially the same height, the connection positions A of the wirings 43 to their corresponding feed-through terminals 25 and the connection positions B of the wirings 43 to their corresponding internal substrates 14A and 14B are located at substantially the same height.

Figure 6:
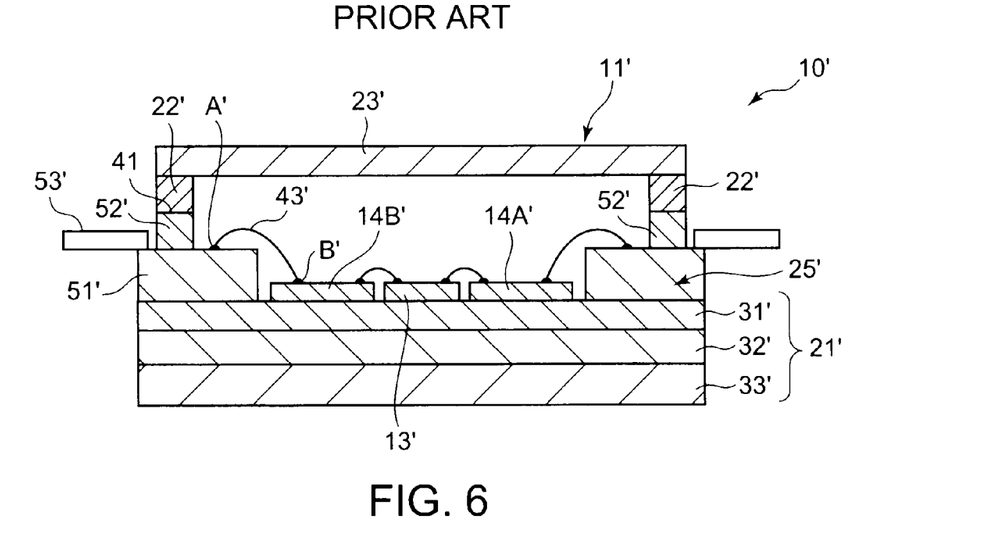
FIG. 6 is a sectional view showing a semiconductor device of a conventional example.

Next, some advantages of the semiconductor element housing package 11 and the semiconductor device 10 of this embodiment are described by comparison to a conventional semiconductor device. FIG. 6 shows the configuration of a conventional semiconductor device 10'. The conventional semiconductor device 10' includes a base plate 21' with no recessed portions 37 formed therein. In addition, each feed-through terminal 25' includes a lower component 51' that is fixed to the top surface of a first layer 31'. Accordingly, the use of relatively thick feed-through terminals 25' increases the thickness of a semiconductor element housing package 11'.

In addition, if each feed-through terminal 25' used in the conventional semiconductor device 10' is thicker than each of internal substrates 14A' and 14B', the top surface of each lower component 51' is positioned at a higher level than the top surfaces of the internal substrates 14A' and 14B'. Accordingly, there is a level difference between a connection position A' of each wire 43' to the corresponding feed-through terminal 25' and a connection position B' of each wire 43' to the corresponding one of the internal substrates 14A' and 14B'. Consequently, the wires 43' have to be longer.

By contrast, in the semiconductor device 10 of this embodiment shown in FIG. 3, the base plate 21 of the semiconductor element housing package 11 has the recessed portions 37, and the bottom surface of the lower component 51 of each feed-through terminal 25 is fixed to the floor of the corresponding recessed portion 37. Accordingly, the bottom-end surface of each feed-through terminal 25 is positioned at a lower level than the top surface of the base plate 21 by an amount equivalent to the thickness of the first layer 31 (the depth of each recessed portion 37). Consequently, the thickness of semiconductor element housing package 11 can be reduced irrespective of the thickness of each feed-through terminal 25.

In addition, in the semiconductor device 10, the bottom surface of the lower component 51 of each feed-through terminal 25 is fixed to the floor of the corresponding recessed portion 37 of the base plate 21, and thereby the top surface of each lower component 51 and the top surfaces of the internal substrates 14A and 14B are positioned at substantially the same height. Accordingly, the connection positions A of the wirings 43 to their corresponding feed-through terminals 25 and the connection positions B of the wirings 43 to their corresponding internal substrates 14A and 14B are located at substantially the same height. In other words, even if feed-through terminals 25 thicker than the internal substrates 14A and 14B are used, the level difference between each of the connection positions A of the wirings 43 to their corresponding feed-through terminals 25 and the corresponding one of the connection positions B of the wirings 43 to their corresponding internal substrates 14A and 14B can be smaller than that of the conventional semiconductor device 10'. Consequently, the wires 43 between the feed-through terminals 25 and their corresponding internal substrates 14A and 14B can be shortened, and thereby the inductance (L) to be generated can be reduced.

The semiconductor device 10 and the semiconductor element housing package 11 of this embodiment with the above-described configurations have the following advantageous effects. Firstly, the thickness of the semiconductor element housing package 11 can be reduced irrespective of the thickness of each feed-through terminal 25. Accordingly, the semiconductor element housing package 11 and the semiconductor device 10 can have smaller thicknesses.

In addition, if the feed-through terminals 25 used in the semiconductor device 10 of this embodiment are thicker than the internal substrates 14A and 14B, the wires 43 between the feed-through terminals 25 and their corresponding internal substrates 14A and 14B can be shorter than their counterparts (wires 43') of the conventional semiconductor device 10', and thereby the value of the inductance (L) to be generated can be smaller than that of the conventional case. Accordingly, the mismatching of impedances between each matching circuit and the corresponding feed-through terminal 25 can be avoided, and thereby electrical characteristics, such as the output and the efficiency, of the semiconductor device 10 can be prevented from being impaired.

Note that in the above-described embodiment, the top surfaces of the lower components 51 of the feed-through terminals 25 and the top surfaces of the internal substrates 14A and 14B are positioned at substantially the same height. Such configuration makes the wires 43 even shorter, allowing more effective prevention of the impairing of electrical characteristics.

Modifications of Embodiment 1

Next, modifications of Embodiment 1 are described by referring to FIGS. 7 to 13. The same portions as or portions with the same functions as those in Embodiment 1 are denoted by the same reference numerals used in Embodiment 1, and no description of such portions will be given.

Figure 7:
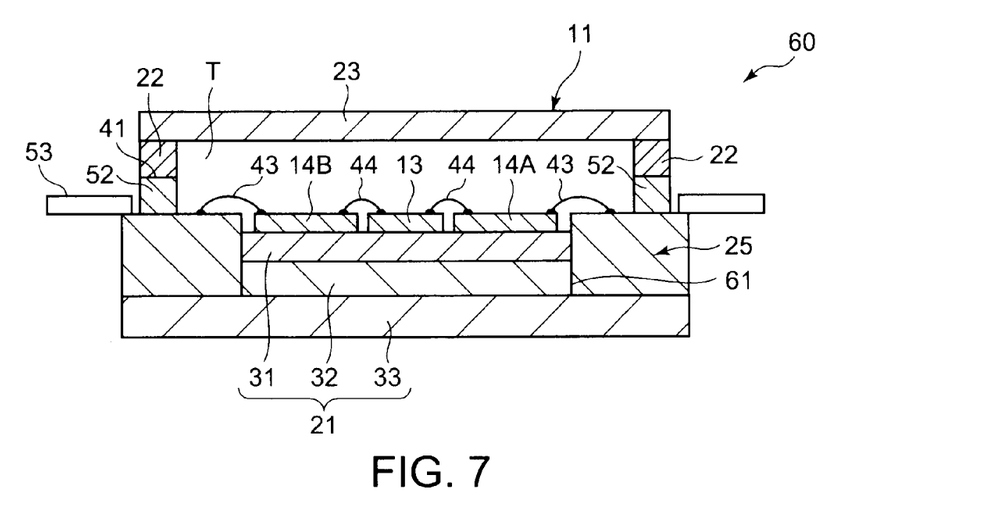
FIG. 7 is a sectional view showing a semiconductor device of Modification 1 of Embodiment 1.

FIG. 7 shows the semiconductor element housing package 11 and a semiconductor device 60 of Modification 1. Recessed portions 61 each with a depth equivalent to the total thickness of the first and the second layers 31 and 32 are provided in the base plate 21. The bottom end of each feed-through terminal 25 is fixed to the top surface of the third layer 33. Thus, even if feed-through terminals 25 thicker than those used in Embodiment 1 are used, the semiconductor element housing package 11 and the semiconductor device 60 can have smaller thicknesses.

Figure 8:
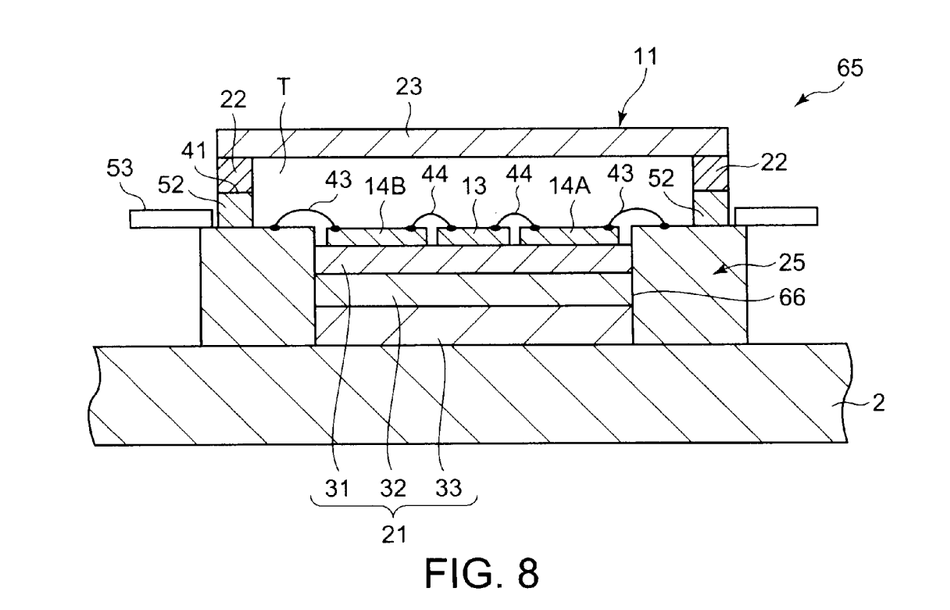
FIG. 8 is a sectional view showing a semiconductor device of Modification 2 of Embodiment 1.

FIG. 8 shows the semiconductor element housing package 11 and a semiconductor device 65 of Modification 2. Recessed portions 66 are formed as hole portions formed through the base plate 21 in the thickness direction thereof. The depth of each recessed portion 66 is equivalent to the total thickness of the first to the third layers 31 to 33. Each feed-through terminal 25 is fixed to the corresponding side surface of the base plate 21. Note that the bottom end of each feed-through terminal 25 may be fixed to the top surface of the heat sink 2.

Figure 9:
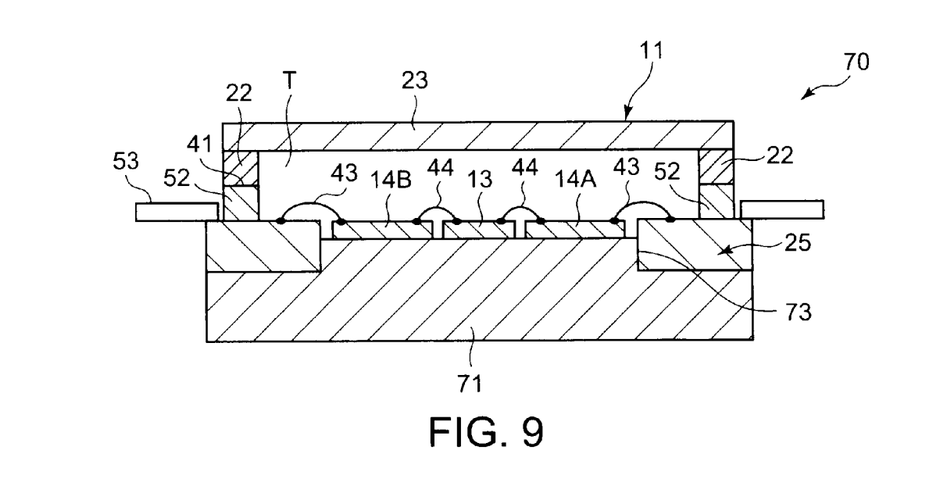
FIG. 9 is a sectional view showing a semiconductor device of Modification 3 of Embodiment 1.

FIG. 9 shows the semiconductor element housing package 11 and a semiconductor device 70 of Modification 3. A base plate 71 has a single-layer structure instead of a laminate structure. The base plate 71 is made of a sintered alloy containing a material with a high thermal conductivity and a material with a low CTE, such as a sintered alloy of copper and diamond, or a sintered alloy of aluminum and silicon carbide. Two groove-shaped recessed portions 73 are formed in the base plate 71, and the bottom end of each feed-through terminal 25 is fixed to the bottom surface of the corresponding recessed portion 73. The recessed portions 73 are not formed as, for example, hole portions formed through the first layer 31 in the thickness direction thereof, but are formed as groove portions provided in the base plate 71.

Figure 10:
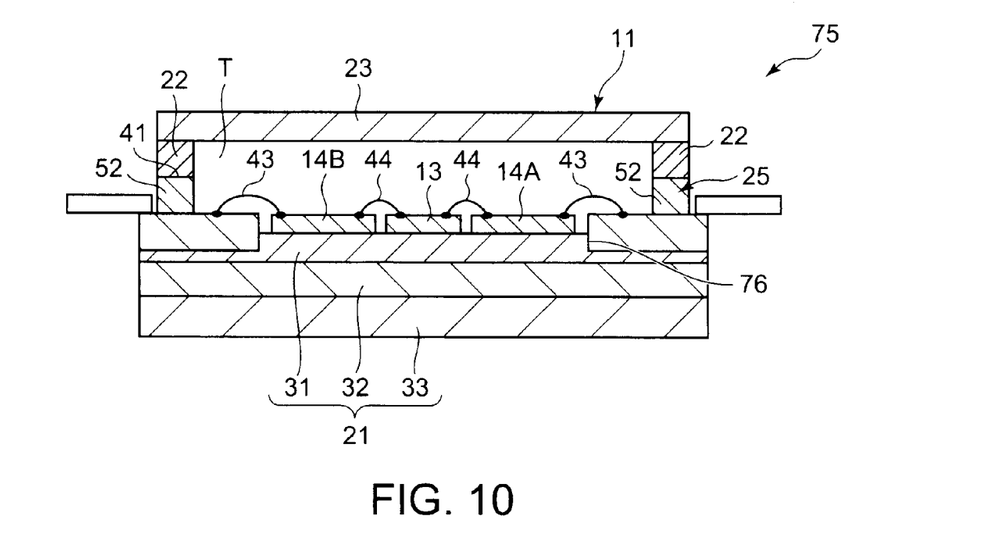
FIG. 10 is a sectional view showing a semiconductor device of Modification 4 of Embodiment 1.

FIG. 10 shows the semiconductor element housing package 11 and a semiconductor device 75 of Modification 4. Each recessed portion 76 has a smaller depth than the thickness of the first layer 31. In other words, the recessed portions 76 are not formed as hole portions formed through the first layer 31 in the thickness direction thereof, but are formed as groove. However, in comparison to Embodiment 1, where the recessed portions 37 are formed as hole portions that are provided through the first layer 31 in the thickness direction thereof before the brazing, the manufacturing of the base plate 21 of this modification requires some extra work. In Embodiment 1, Modification 1, and Modification 2, each of the base plates 21 has a laminate structure, and the recessed portions 37, 61, and 66 are formed as hole portions that are formed through at least one layer in the thickness direction thereof. Accordingly, the manufacturing of the base plates 21 of Embodiment 1, Modification 1, and Modification 2 is easier than in the case of Modification 4.

Figure 11:
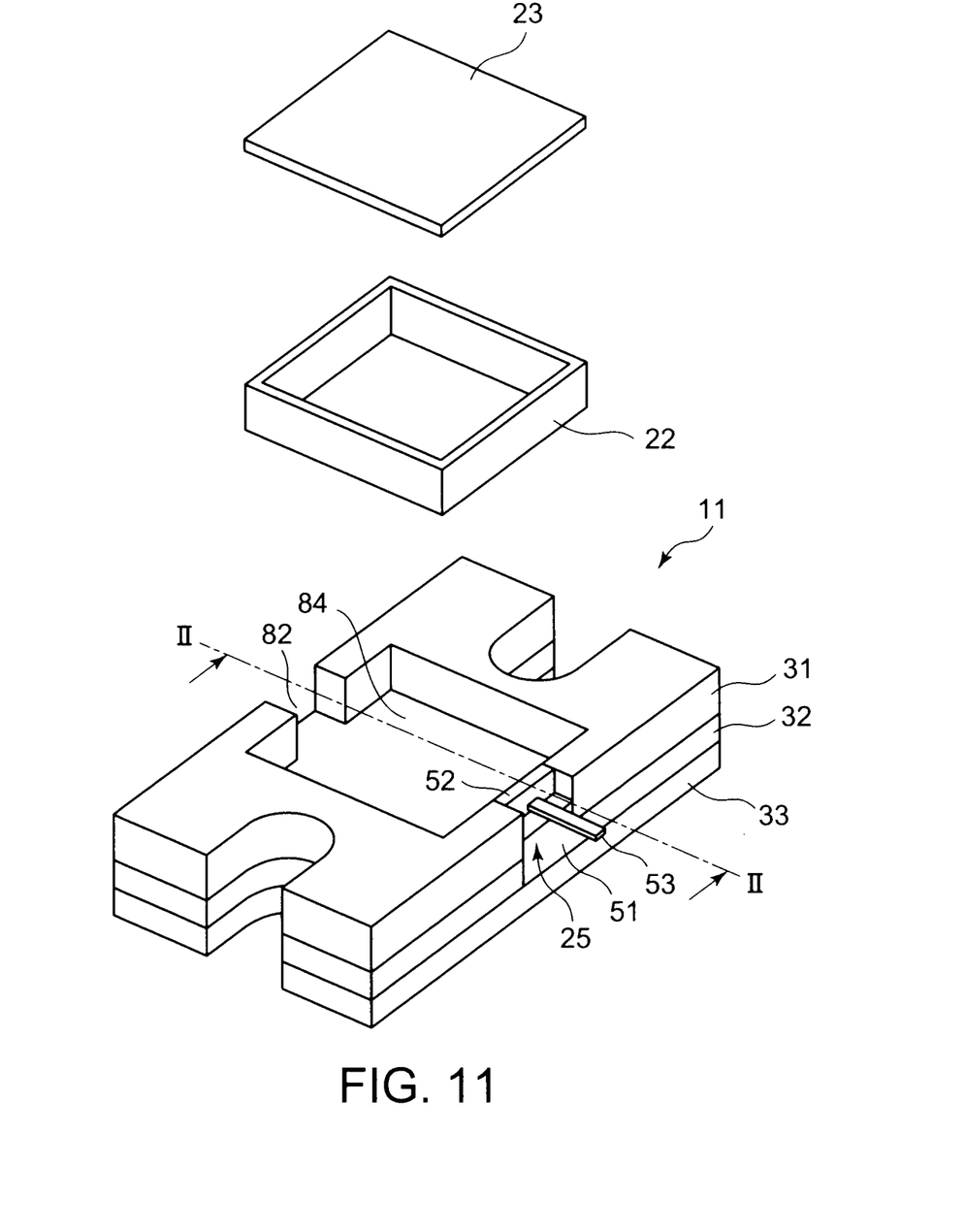
FIG. 11 shows an exploded perspective view showing a semiconductor element housing package of Modification 5.
Figure 12:
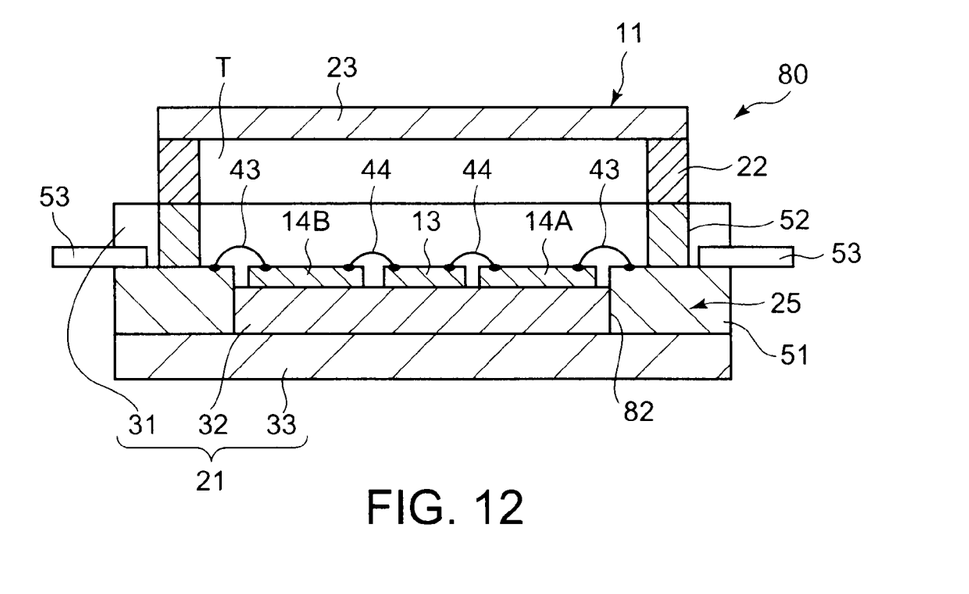
FIG. 12 shows a sectional view showing a semiconductor device taken along a line II-II of FIG. 11.

FIG. 11 shows an exploded perspective view of the semiconductor element housing package 11 of Modification 5. FIG. 12 shows a sectional view of a semiconductor device 80 taken along a line II-II of FIG. 11. In the above-mentioned embodiment and each modification, the peripheral wall 22 has the cut-away portions 41, and the upper components 52 of the feed-through terminals 25 are placed in the cut-away portions 41 of the peripheral wall 22. However, in this modification, the cut-away portions 41 are not formed in the peripheral wall 22. The base plate 21 has recessed portions 82 in an edge portion thereof. Each recessed portion 82 has the depth which is equivalent to the thickness of the feed-through terminal 25. The bottom component 51 and the upper component 52 of the feed-through terminal 25 are placed in a recessed portion 82 of the base plate 21. Another feed-through terminal 25 is not described in FIG. 11.

The base plate 21 has the lamination structure of the 1st layer 31, the 2nd layer 32 and the 3rd layer 33. The depth of the recessed portion 82 equivalent to the thickness of the feed-through terminal 25 is equal to the sum total of the thickness of the 1st layer 31 and the thickness of the 2nd layer 32. The bottom of the bottom component 51 of the feed-through terminal 25 is fixed to the bottom of the recessed portion 82, i.e., a top surface of the 3rd layer 33. The central part of the 1st layer 31 is removed from the 1st layer 31 and a top surface of the 2nd layer 32 is exposed. That is, the base plate 21 has a recessed portion 84 in the central part. The bottom of the recessed portion 82 is located below the bottom of the recessed portion 84. The recessed portions 82 are connected with the recessed portion 84. The peripheral wall 22 is fixed to a top surface of the 1st layer 31, and a lid 23 is also fixed to the upper side of the peripheral wall 22. The semiconductor element housing package 11 is thus configured. The semiconductor element 13 and the inner substrates 14A and 14B are placed on a top surface of the 2nd layer 32 exposed in the recessed portion 84. The top surface of the lower component 52 of the feed-through terminal 25 is substantially the same height of top surfaces of the semiconductor element 13 and the inner substrates 14A and 14B.

Figure 13:
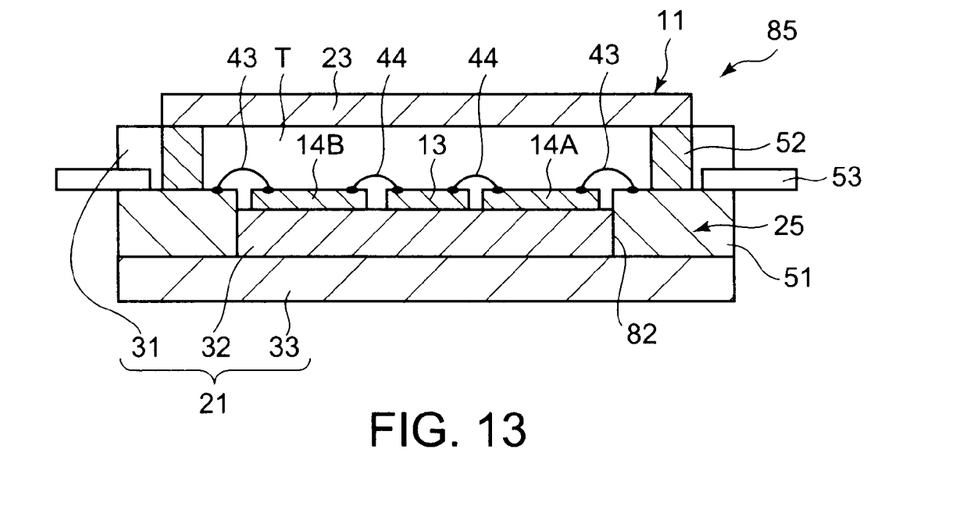
FIG. 13 shows a sectional view showing a semiconductor element housing package 11 and a semiconductor device 85 of Modification 6.

FIG. 13 shows a sectional view of the semiconductor element housing package 11 and a semiconductor device 85 of Modification 6. The semiconductor element housing package 11 has the structure where the peripheral wall 22 was removed from the semiconductor element housing package 11 Modification 5. A lid 23 is directly joined to the 1st layer 31. When the thickness of the semiconductor element 13 and the thickness of the inner substrates 14A and 14B are thin, the semiconductor element housing package 11 of the modification is used.

In the semiconductor element housing package 11 and the semiconductor device 60, 65, 70, 75, 80 or 85 of each of the above-described modifications, the base plate 21 has the recessed portions 37, 61, 66, 73, 76 or 82 that are recessed downward from the top surface of the base plate 21, and the feed-through terminals 25 are fixed to the recessed portions 37, 61, 66, 73, 76 or 82 in such a manner that the bottom ends of the feed-through terminals 25 are positioned lower than the top surface of the base plate 21. Accordingly, both the thickness of the semiconductor element housing package 11 and the thickness of the semiconductor device 60, 65, 70, 75, 80 or 85 can be reduced irrespective of the size of each feed-through terminal 25.

In addition, even if each feed-through terminal 25 used in the semiconductor device 60, 65, 70, 75, 80 or 85 of each modification is thicker than each of the internal substrates 14A and 14B, the fixing of the feed-through terminals 25 to the recessed portions 37, 61, 66, 73, 76 or 82 can reduce the level difference between the connection position A where the wire connecting the corresponding feed-through terminal 25 to the corresponding one of the internal substrates 14A and 14B is connected to the corresponding feed-though terminal 25 and the connection position B where the wire 43 is connected to the corresponding one of the internal substrates 14A and 14B. Accordingly, the wires 43 between the feed-through terminals 25 and the circuits on their corresponding internal substrates 14A and 14B can be shortened, and the value of the inductance (L) to be generated can be reduced. Consequently, mismatching of impedances of the electric circuits can be avoided, and thereby electrical characteristics, such as the output and the efficiency, can be prevented from being impaired.

In addition, in each modification, the top surfaces of the lower components 51 of the feed-through terminals 25 and the top surfaces of the internal substrates 14A and 14B are positioned at substantially the same height. Such configuration can shorten further the wires 43, and prevents more effectively the impairing of the electrical characteristics.

The invention can provide a thin semiconductor element housing package and a thin semiconductor device irrespective of the thickness of each feed-through terminal. In addition, the invention can provide a semiconductor device with excellent electrical characteristics.

Embodiment of the invention and modifications thereof are described above. However, the embodiment and modifications are presented merely as examples and are not intended to restrict the scope of the invention. Such novel embodiments can be carried out in various other forms, and various omissions, replacements, and alterations can be made without departing from the gist of the invention. Such embodiments and the modifications thereof are also included in the scope and the gist of the invention as well as in the invention described in the claims and their equivalents.

What is claimed is:

1. A package for housing a semiconductor element comprising:
   a base plate including a top surface and a recessed portion formed as a downwardly-recessed portion of the top surface;
   a peripheral wall provided on the top surface of the base plate;
   a lid provided on an upper side of the peripheral wall and forming a semiconductor element housing space in cooperation with the base plate and the peripheral wall; and
   a feed-through terminal including a bottom end and fixed to the recessed portion, wherein the feed-through terminal includes: an upper component and a lower component each of which is formed of an insulating member and includes a top surface; and a metalized wiring layer provided on the top surface of the lower component and extending from inside to outside of the semiconductor element housing space;
   wherein the peripheral wall is further provided on the top surface of the upper component of the feed-through terminal,
   the peripheral wall includes a cut-away portion formed at a position corresponding to the recessed portion and extending toward the lid,
   the upper component is placed in the cut-away portion, and the lower component is placed in the recessed portion.

2. The package for housing semiconductor element according to claim 1, wherein
   the base plate has a laminate structure including a plurality of layers, and
   the recessed portion includes a hole portion penetrating at least the uppermost one of the plurality of layers in the thickness direction thereof.

3. The package for housing semiconductor element according to claim 1, wherein
   the base plate is formed of a single layer made of a sintered alloy, and
   the recessed portion is provided in a top surface of the layer.

4. The package for housing semiconductor element according to claim 1, wherein the base plate further includes another recessed portion formed as a downwardly-recessed portion of the top surface at the central portion thereof, a bottom of the recessed portion is located below a bottom of the another recessed portion, and the upper component and the lower component are placed in the recessed portion.

5. A semiconductor device comprising:
   a base plate including a top surface and a recessed portion formed as a downwardly-recessed portion of the top surface;
   a peripheral wall provided on the top surface of the base plate;
   a lid provided on an upper side of the peripheral wall and forming a semiconductor element housing space in cooperation with the base plate and the peripheral wall;
   a feed-through terminal including a bottom end and fixed to the recessed portion so that the bottom end is located at a lower position than the top surface of the base plate except the recessed portion, wherein the feed-through terminal includes: an upper component and a lower component each of which is formed of an insulating member and includes a top surface; and a metalized wiring layer provided on the top surface of the lower component and extending from inside to outside of the semiconductor element housing space;
   an internal substrate placed on the top surface of the base plate in the semiconductor element housing space;
   a semiconductor element placed on the top surface of the base plate in the semiconductor element housing space;
   a first wire connecting the feed-through terminal and the internal substrate; and
   a second wire connecting the internal substrate and the semiconductor element;
   wherein the peripheral wall includes a cut-away portion formed at a position corresponding to the recessed portion and extending toward the lid,
   the upper component is placed in the cut-away portion, and the lower component is placed in the recessed portion.

6. The semiconductor device according to claim 5, wherein a position where the first wire is connected to the feed-through terminal and a position where the first wire is connected to the internal substrate are located at substantially the same height.

7. A semiconductor device comprising:
   a base plate including a top surface and a recessed portion formed as a downwardly-recessed portion of the top surface;
   a peripheral wall provided on the top surface of the base plate;
   a lid provided on an upper side of the peripheral wall and forming a semiconductor element housing space in cooperation with the base plate and the peripheral wall;
   a feed-through terminal including a bottom end and fixed to the recessed portion, wherein the feed-through terminal includes: an upper component and a lower component each of which is formed of an insulating member and includes a top surface; and a metalized wiring layer provided on the top surface of the lower component and extending from inside to outside of the semiconductor element housing space;
   wherein the peripheral wall is further provided on the top surface of the upper component of the feed-through terminal;
   an internal substrate which is placed on the top surface of the base plate in the semiconductor element housing space, and which includes a top surface and a circuit formed on the top surface thereof;
   a semiconductor element placed on the top surface of the base plate in the semiconductor element housing space;
   a first wire connecting the feed-through terminal and the circuit of the internal substrate; and
   a second wire connecting the semiconductor element and the circuit of the internal substrate,
   wherein the lower component is fixed to the recessed portion so that the top surface of the lower component and the top surface of the internal substrate are positioned at substantially the same height,
   a position where the first wire is connected to the feed-through terminal is provided on the metalized wiring layer provided on the top surface of the lower component,
   the peripheral wall includes a cut-away portion formed at a position corresponding to the recessed portion and extending toward the lid,
   the upper component is placed in the cut-away portion, and the lower component is placed in the recessed portion.

8. A semiconductor device comprising:
   a base plate having a top surface, a first recessed portion formed as a downwardly-recessed portion of the top surface at the central portion thereof and a second recessed portion formed as a downwardly-recessed portion of the top surface at a peripheral portion thereof, and a bottom of the second recessed portion being located below a bottom of the first recessed portion;

a lid fixed to the top surface of the base plate to cover the first recessed portion and forming a semiconductor element housing space in cooperation with the base plate; and a feed-through terminal having a bottom end and fixed to the second recessed portion so that the bottom end is located below the top surface of the base plate other than the second recessed portion, wherein the feed-through terminal includes: an upper component and a lower component each of which is formed of an insulating member and includes a top surface; and a metalized wiring layer provided on the top surface of the lower component and extending from inside to outside of the semiconductor element housing space;

an inner substrate placed on the bottom of the first recessed portion and in the semiconductor element housing space; a semiconductor element placed on the bottom of the first recessed portion and in the semiconductor element housing space;

a first wire connecting the feed-through terminal and the inner substrate; and a second wire connecting the inner substrate and the semiconductor element.

* * * * *